United States Patent
Liang et al.

(10) Patent No.: US 12,111,348 B2
(45) Date of Patent: Oct. 8, 2024

(54) EVALUATION MODULE AND EVALUATION METHOD FOR EVALUATING MULTICHIP MODULE LIFESPAN

(71) Applicants: Robert Bosch GmbH, Stuttgart (DE); Huazhong University of Science and Technology, Wuhan (CN)

(72) Inventors: Lin Liang, Wuhan (CN); Lubin Han, Wuhan (CN); Yong Kang, Wuhan (CN); Xudan Liu, Shanghai (CN); Maojun He, Shanghai (CN)

(73) Assignees: Robert Bosch GmbH, Stuttgart (DE); Huazhong University of Science and Technology, Wuhan (CN)

( * ) Notice: Subject to any disclaimer, the term of this patent is extended or adjusted under 35 U.S.C. 154(b) by 591 days.

(21) Appl. No.: 17/483,411

(22) Filed: Sep. 23, 2021

(65) Prior Publication Data
US 2022/0099731 A1   Mar. 31, 2022

(30) Foreign Application Priority Data
Sep. 28, 2020   (CN) .......................... 202011038511.4

(51) Int. Cl.
G01R 31/28   (2006.01)
H01L 25/11   (2006.01)
H01L 29/16   (2006.01)

(52) U.S. Cl.
CPC ........ G01R 31/2874 (2013.01); H01L 25/115 (2013.01); H01L 29/1608 (2013.01)

(58) Field of Classification Search
CPC ............ G01R 31/2874; G01R 31/2855; H01L 25/115; H01L 29/1608; H01L 22/34;
(Continued)

(56) References Cited

U.S. PATENT DOCUMENTS

2014/0247857 A1\*  9/2014  Han ................... G01R 31/2874
374/57
2016/0377674 A1\*  12/2016  Bickford ............ G05B 19/4188
324/750.01

FOREIGN PATENT DOCUMENTS

CN   105069258 A   11/2015
CN   106291309 A    1/2017
(Continued)

*Primary Examiner* — Alexander Satanovsky
*Assistant Examiner* — Asm Fakhruddin
(74) *Attorney, Agent, or Firm* — Maginot, Moore & Beck LLP (57) ABSTRACT

An evaluation module configured to evaluate the lifespan of a multichip module, the multichip module comprising a first substrate and multiple chips under evaluation, includes a second substrate, configured to be the same as the first substrate, and having attachment positions corresponding to the attachment positions on the first substrate, and at least one evaluation chip, configured to be the same as the multiple chips under evaluation. The number of evaluation chips is less than the number of chips under evaluation by at least one. The at least one evaluation chip is arranged at an attachment position on the second substrate, such that the at least one evaluation chip and the chip under evaluation arranged at the corresponding attachment position on the multichip module have the same cooling performance and sustain the same thermal stress. The present disclosure also discloses a method for evaluating the lifespan of a multichip module.

17 Claims, 5 Drawing Sheets

(58) Field of Classification Search
CPC ....... H01L 23/562; H01L 24/29; H01L 24/32;
H01L 24/33; H01L 24/83; H01L 25/072;
H01L 2224/29339; H01L 2224/32225;
H01L 2224/33181; H01L 2224/8384;
H01L 2924/10272; H01L 2924/13091
See application file for complete search history.

(56) References Cited

FOREIGN PATENT DOCUMENTS

| | | | | |
|---|---|---|---|---|
| CN | 107991597 A | | 5/2018 | |
| JP | H7-60847 B2 | | 6/1995 | |
| JP | 2016532074 A | * | 10/2016 | ............. H01L 24/29 |
| JP | 2019-114659 A | | 7/2019 | |

* cited by examiner

EVALUATION MODULE AND EVALUATION METHOD FOR EVALUATING MULTICHIP MODULE LIFESPAN

This application claims priority under 35 U.S.C. § 119 to patent application no. CN 2020 11038511.4, filed on Sep. 28, 2020 in China, the disclosure of which is incorporated herein by reference in its entirety.

The present application relates to the technical field of electronic device testing, in particular to an evaluation module and evaluation method for evaluating multichip module lifespan.

BACKGROUND

A multichip module is essentially a module comprising two or more micro-circuits (e.g. discrete semiconductor devices, integrated circuits, etc.). In a multichip module, multiple devices are arranged on the same substrate, and packaged as a single component. For example, a silicon carbide (SiC) module comprises multiple MOSFET chips arranged on a substrate, which are connected in series or in parallel or form a half-bridge or full-bridge structure, and can form a single module using conventional bonding wire packaging with single-sided cooling or no-bonding-wire packaging with double-sided cooling.

As the arrangement structures or package forms of multichip modules change or new modules appear, there is a need to perform accelerated ageing experiments on large numbers of modules, in order to test the reliability of the modules and evaluate their lifespan. Due to the fact that a multichip module comprises multiple chips, its cost is generally several times higher than that of a single-chip module, and as a result, the entire testing process has a high cost in terms of devices; moreover, due to the structural complexity of multichip modules, the corresponding testing system also greatly increases the cost of reliability and lifespan evaluation, and makes the process of testing and evaluation more complex.

Thus, there is a need for an improved solution for evaluating multichip module reliability and lifespan, in order to lower the cost of testing and simplify the evaluation process.

SUMMARY

An object of the present application is to propose a simplified evaluation module and evaluation method for evaluating multichip module lifespan, in response to the shortcomings in an existing multichip module lifespan evaluation method, in order to reduce the cost of testing and simplify the evaluation process.

According to one aspect of the present disclosure, an evaluation module is provided for evaluating the lifespan of a multichip module, the multichip module comprising a first substrate and multiple chips under evaluation arranged at attachment positions on the first substrate, wherein the evaluation module comprises: a second substrate, configured to be the same as the first substrate of the multichip module, and having attachment positions corresponding to the attachment positions on the first substrate of the multichip module; and at least one evaluation chip, configured to be the same as the multiple chips under evaluation of the multichip module, the number of the at least one evaluation chip being less than the number of the multiple chips under evaluation of the multichip module by at least one, wherein the at least one evaluation chip is arranged at at least one attachment position on the second substrate, such that the at least one evaluation chip and the chip under evaluation arranged at the corresponding attachment position on the multichip module have the same cooling performance and sustain the same thermal stress.

According to another aspect of the present application, a method for evaluating the lifespan of a multichip module is also provided, characterized in that the method comprises the following steps:
a. providing the evaluation module as described above;
b. determining multiple sets of test stresses and the number of the evaluation modules;
c. performing accelerated lifespan testing of the evaluation module;
d. calculating a reliability function of the evaluation module under each set of test stresses;
e. calculating a lifespan prediction model of the evaluation module;
f. calculating a reliability function of the multichip module under each set of test stresses;
g. calculating a lifespan prediction model of the multichip module;
h. calculating the lifespan of the multichip module under actual operating conditions.

The evaluation module of the present application has a reduced number of chips compared with the multichip module under evaluation, and undergoes an accelerated ageing experiment with the thermal stress sustained by the chip and the cooling performance thereof remaining substantially unchanged, and an equivalent lifespan evaluation method is used to calculate an equivalent lifespan of the multichip module; it is thus possible to greatly reduce the cost of testing and simplify the testing process.

BRIEF DESCRIPTION OF THE DRAWINGS

Exemplary embodiments of the present application are described in detail below with reference to the drawings. It must be pointed out that the scales of the drawings might be different in order to achieve clarity of illustration, but this has no effect on the understanding of the present application. In the drawings.

DETAILED DESCRIPTION

Exemplary embodiments of the present application are described in detail below in conjunction with examples. In the embodiments of the present application, an evaluation module and evaluation method for evaluating the lifespan of a power SiC module are taken as an example to describe the present application. However, those skilled in the art should understand, these exemplary embodiments do not mean that the present application is limited in any way. For example, the principles of the present application can be used to evaluate an electronic module for processing information, etc.

In addition, in the absence of conflict, features in the embodiments of the present application can be combined. For conciseness, other components and steps are omitted in the drawings, but this does not mean that the evaluation module of the present application cannot comprise other components, and does not mean that the evaluation method of the present application cannot comprise other steps. It should be understood that the dimensions and proportional relationships of the components, the number of components and the number of steps in the drawings do not limit the present application.

It should be pointed out that although terms such as "first" and "second" are used herein to describe various elements, these elements should not be limited by these terms. These terms are merely used to distinguish one element from another element. For example, without departing from the scope of the present application, a first element could be called a second element, and similarly, a second element could be called a first element.

Figure 1:
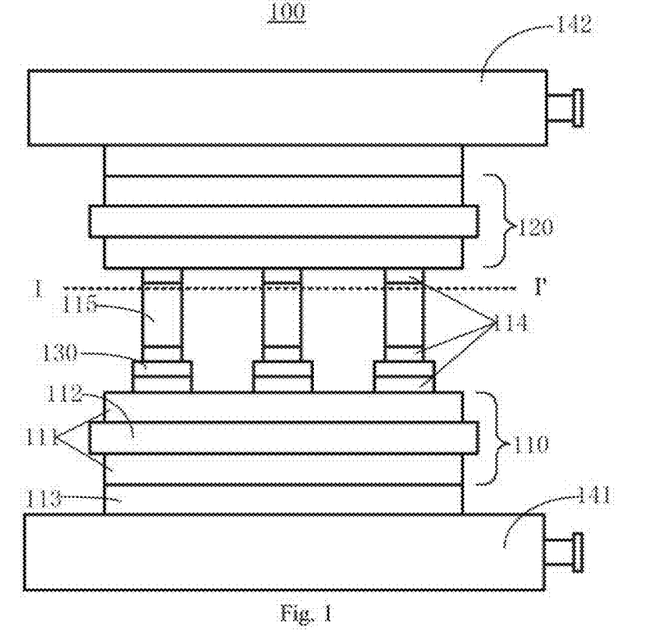
FIG. 1 is a schematic side view of a multichip module according to an embodiment of the present application.
Figure 2:
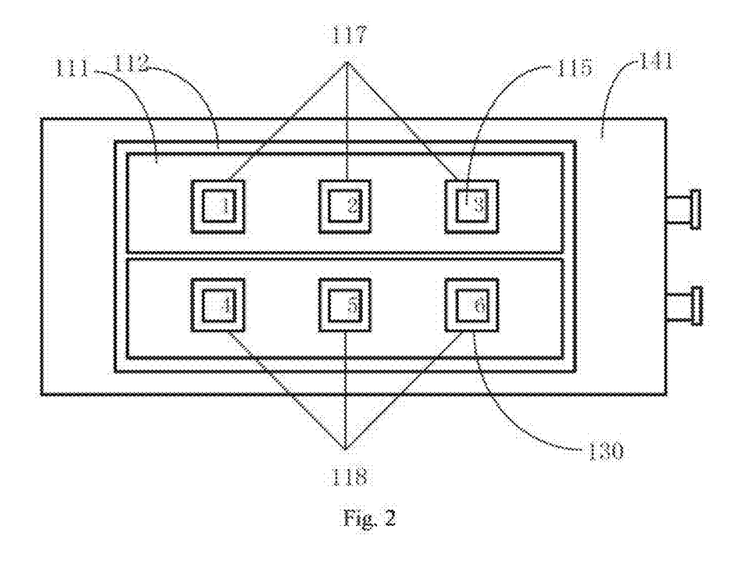
FIG. 2 is a schematic sectional view of the multichip module, taken along line I-I' in FIG. 1.

The present application is described below, taking a typical 6-chip SiC module with double-sided cooling packaging as the multichip module under evaluation. As shown in FIGS. 1 and 2, the multichip module under evaluation (e.g. a 1200 V, 100 A 6-chip SiC half-bridge module with double-sided cooling) 100 comprises a first substrate 110 and chips under evaluation (e.g. silicon carbide MOSFET chips) 130; 6 attachment positions are provided on the first substrate 110, labelled with the numbers 1, 2, 3, 4, 5 and 6 respectively, and 6 chips under evaluation 130 are arranged at the 6 attachment positions on the first substrate 110. Specifically, the 3 chips under evaluation located at attachment positions 1 to 3 form an upper bridge arm 117, and the 3 chips under evaluation located at attachment positions 4 to 6 form a lower bridge arm 118, such that each bridge arm comprises 3 parallel-connected chips under evaluation 130. A bottom side of each chip under evaluation 130 is attached (e.g. by sintering) to the first substrate 110 by means of nano-silver 114, and a metal pillar (e.g. copper pillar) 115 with high thermal conductivity and high electrical conductivity is attached to a top side of the chip under evaluation 130 by means of nano-silver 114. Another side of the metal pillar 115 is also attached to a third substrate 120 by means of nano-silver 114. A first heat sink 141 and a third heat sink 142 are connected to the first substrate 110 and third substrate 120 respectively by means of thermally conductive silicon grease 113. In addition, FIGS. 1 and 2 also show that the first substrate 110 and third substrate 120 each comprise a three-layer structure, i.e. two layers of covering copper 111 and one layer of aluminum nitride ceramic 112 between the two layers of covering copper 111, but the present application is not limited to this; the first substrate 110 and third substrate 120 may each be a single-layer structure, a two-layer structure or a structure having a greater number of layers, and may be made of any suitable material.

In this type of multichip package structure, the cost of the chips under evaluation accounts for more than 80% of the cost of the entire module, and the cost of the chips under evaluation needed to complete lifespan evaluation of the power module accounts for nearly 90% of the total cost. Thus, reducing the cost of the chips under evaluation, i.e. reducing the number of chips, is an important step in the lifespan evaluation of the multichip module.

Figure 3:
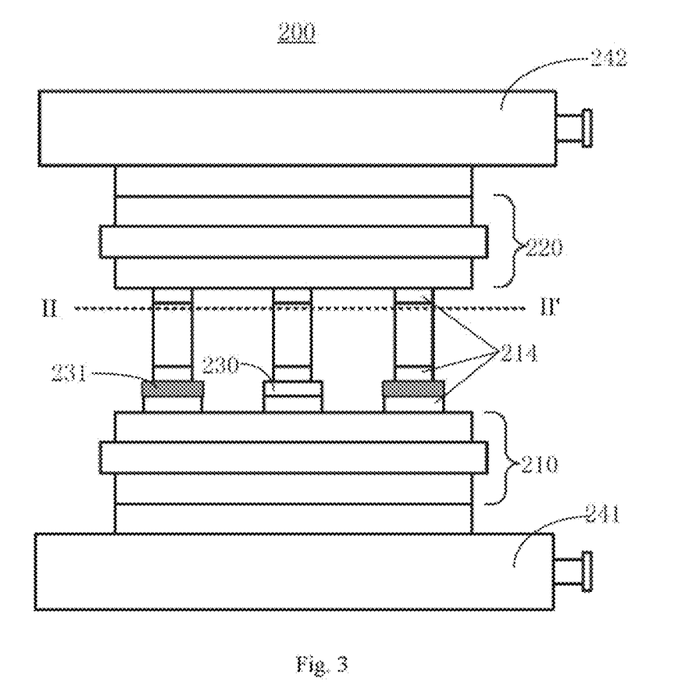
FIG. 3 is a schematic side view of an evaluation module according to an embodiment of the present application for evaluating the lifespan of the multichip module shown in FIG. 1.
Figure 4:
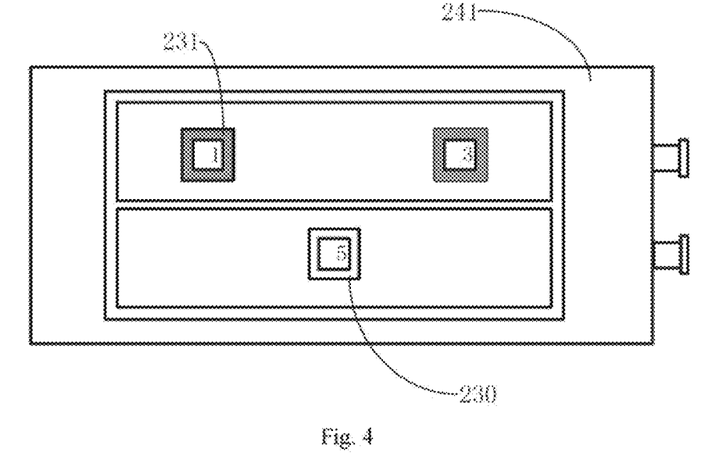
FIG. 4 is a schematic sectional view of the evaluation module, taken along line II-IF in FIG. 3.

According to an embodiment of the present application, an evaluation module 200 of the present application for evaluating the SiC module with double-sided cooling packaging described above is shown in FIGS. 3 and 4. In the present application, a single-chip SiC module is used as the evaluation module 200 for evaluating the lifespan of the 6-chip SiC module, and the lifespan of the single-chip SiC module is used to calculate an equivalent lifespan of the 6-chip SiC module. As shown in FIG. 3, the evaluation module 200 of the present application comprises a second substrate 210, configured to be the same as the first substrate 110 of the multichip module 100, and having attachment positions corresponding to attachment positions on the first substrate 110 of the multichip module 100. In addition, as shown in FIG. 4, the evaluation module 200 further comprises at least one evaluation chip 230 (only one being shown in FIG. 4) configured to be the same as the chip under evaluation 130 of the multichip module 100, and the at least one evaluation chip 230 has the same cooling performance and sustains the same thermal stress as the chip under evaluation 130 arranged at the corresponding attachment position on the multichip module 100. Thus, compared with the 6-chip SiC module under evaluation, the single-chip evaluation module 200 has a markedly reduced number of chips. It should be pointed out that although only one evaluation chip 230 is shown in FIG. 4, the evaluation module 200 may comprise more than one evaluation chip, and the number of evaluation chips 230 should be less than the number of chips under evaluation 130, e.g. less by at least one, and the effect of reducing the number of chips can likewise be achieved to a certain extent. Preferably, the evaluation module 200 comprises only one evaluation chip 230, i.e. is a single-chip evaluation module.

With the number of chips reduced, it should be ensured that compared with the multichip module 100, the chip junction temperature and thermal stress sustained by the evaluation chip and connecting layers at two sides are not changed in the evaluation module 200 with the reduced number of chips. As shown in FIGS. 3 and 4, the evaluation module 200 of the present application further comprises at least one chip substitute 231 arranged on the second substrate 210, the at least one evaluation chip 230 and at least one chip substitute 231 being configured to be able to keep the evaluation module 200 structurally balanced during evaluation. Specifically, it is ensured that the evaluation module 200 will not warp and deform due to an imbalance of forces sustained, so that the thermal stress sustained by the evaluation chip 230 and the cooling performance thereof are not affected. As shown in FIG. 4, the chips under evaluation at the no. 2, no. 4 and no. 6 attachment positions on the first substrate 110 of the original multichip module 100 are removed, and the chips under evaluation at the no. 1 and no. 3 attachment positions are replaced with chip substitutes (e.g. made of SiC material with high resistivity) 231. By providing the chip substitutes 231 at the no. 1 and no. 3 attachment positions, it is possible to ensure that a top-side fourth substrate 220 and a top-side fourth heat sink 242 still maintain structural balance so that the fourth substrate 220 does not warp and deform under the action of gravity and thermal stress, etc., thereby affecting the cooling performance and thermal stress of the chip under evaluation 230 at the no. 5 attachment position. Thus, the evaluation chip 230 and chip substitutes 231 of the evaluation module 200 do not occupy all of the attachment positions on the second substrate 210, instead being provided at at least some of the attachment positions on the second substrate 210 of the evaluation module 200, but still keep the evaluation module 200 structurally balanced, and the at least one evaluation chip 230 and the chip under evaluation 130 arranged at the corresponding attachment position on the multichip module 100 have the same cooling performance and sustain the same thermal stress. For example, the at least one evaluation chip 230 and at least one chip substitute 231 are provided at vertices of a polygon at least comprising a triangle, wherein, when the second substrate 310 is placed horizontally, the center of gravity line of a component arranged above the at least one evaluation chip 230 and at least one chip substitute 231 passes through a region defined by the polygon. In the embodiment shown in FIGS. 3 and 4, the center of gravity line of the fourth substrate 220 and the fourth heat sink 242 thereabove passes downward through a region formed by the at least one evaluation chip 230 and at least one chip substitute 231 and defined by a triangle. This ensures that the fourth substrate 220 and the fourth heat sink 242 thereabove maintain structural balance during testing, so that the cooling performance and thermal stress of the chip under evaluation 230 can easily be kept unchanged.

In an embodiment of the present application, the chip substitute 231 is made of SiC material with high resistivity; this can prevent short-circuiting of covering copper of the second substrate 210 and covering copper of the fourth substrate 220, and additionally, the thermomechanical properties of the SiC material can be well matched to the SiC chip, making it possible to minimize the effect on the thermal stress and cooling performance of the evaluation module 200 after the number of chips has been reduced.

It should be noted that, if the package structure of the evaluation module 200 is able to ensure that the thermal stress sustained by the evaluation chip 230 and the cooling performance thereof are the same as the thermal stress sustained by the chip under evaluation on the module under evaluation and the cooling performance thereof and that the entire evaluation module is structurally balanced, then the chip substitute can be omitted; instead, certain features of the package structure provide effects and functions similar to those of the chip substitute. Thus, the present application is not limited to the embodiment described above that includes chip substitutes.

It should be pointed out that the evaluation module 200 shown in FIGS. 3 and 4 comprises some components which are identical to components of the multichip module 100 shown in FIGS. 1 and 2 and have not been labelled. Similarly, a bottom side of the evaluation chip 230 of the evaluation module 200 is attached (e.g. by sintering) to the second substrate 210 by means of nano-silver 214, and a metal pillar (e.g. copper pillar) with high thermal conductivity and high electrical conductivity is attached to a top side of the evaluation chip 230 by means of nano-silver. Another side of the metal pillar is also attached to the fourth substrate 220 by means of nano-silver. A second heat sink 241 and the fourth heat sink 242 are connected to the second substrate 210 and fourth substrate 220 respectively by means of thermally conductive silicon grease. In addition, FIGS. 3 and 4 also show that the second substrate 210 and fourth substrate 220 each comprise a three-layer structure, i.e. two layers of covering copper and one layer of aluminum nitride ceramic between the two layers of covering copper. Similarly, the second substrate 210 and fourth substrate 220 may each also be a single-layer structure, a two-layer structure or a structure having a greater number of layers, and may be made of any suitable material.

Through simplification, the 6-chip SiC module under evaluation becomes the single-chip SiC module used for evaluation, with a cost of approximately ⅙ of the original. Table 1 below compares the thermal stresses and temperatures of the 6-chip SiC module under evaluation and the single-chip SiC module used for evaluation, obtained by software simulation.

TABLE 1

Comparison of thermal stresses and temperatures of 6-chip SiC module and single-chip SiC module

| | | Steady-state thermal stress (Mpa) | | | |
|---|---|---|---|---|---|
| | No. | Bottom layer nano-silver | Middle nano-silver | Top layer nano-silver | Chip temperature (° C.) |
| 6-chip SiC module | 1 | 23.43 | 14.84 | 14.82 | 113.42 |
| | 2 | 23.63 | 14.82 | 15.20 | 114.29 |
| | 3 | 23.43 | 14.84 | 14.82 | 113.43 |
| | 4 | 24.07 | 14.93 | 14.78 | 113.6 |
| | 5 | 24.20 | 15.08 | 15.11 | 114.48 |
| | 6 | 24.07 | 14.94 | 14.77 | 113.61 |
| Single-chip SiC module | 5 | 23.42 | 14.75 | 14.49 | 114.48 |

It can be seen from the results in Table 1 that after simplification of the SiC module used for evaluation, the thermal stress sustained by the module and the cooling performance thereof are substantially unaffected. Thus, it is possible to subject the single-chip evaluation module to accelerated ageing experiments, and use an equivalent lifespan evaluation method to calculate the equivalent lifespan of the multichip module under evaluation, thereby greatly reducing the cost of testing.

It should be pointed out that FIGS. 1-4 show SiC modules with double-sided cooling packaging, each having an upper substrate and a lower substrate, with the chips arranged between the upper substrate and lower substrate; however, some multichip modules under evaluation might have a substrate at only one side. In this case, an evaluation module having a substrate at only one side can also be formed according to the principles of the present application, and it is likewise possible to achieve the objectives of reducing the number of chips and lowering the cost of testing. Thus, the present application is not limited to the specific structures shown in FIGS. 1-4.

Figure 5:
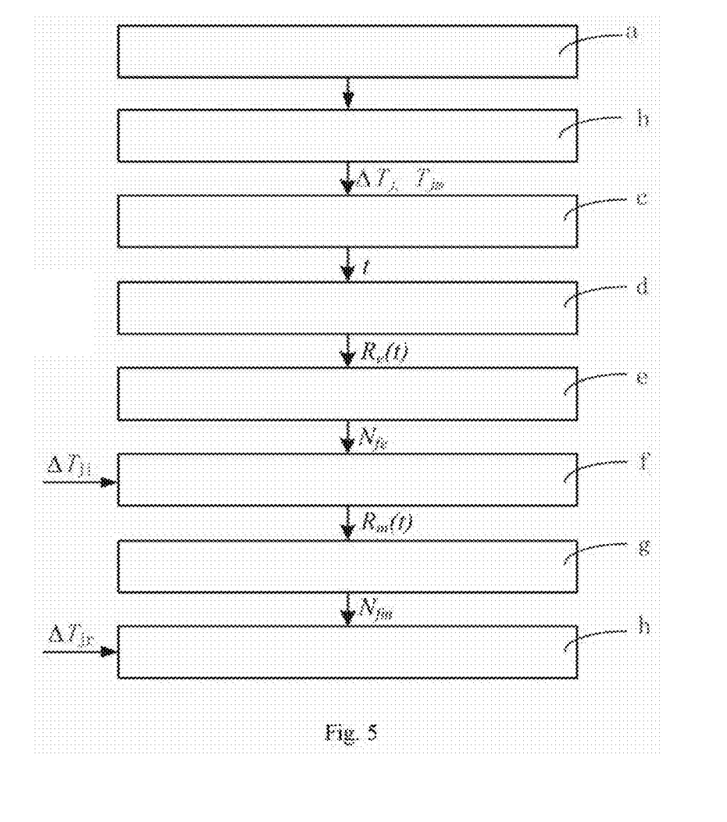
FIG. 5 is a schematic flow chart of an evaluation method according to an embodiment of the present application for using the evaluation module shown in FIG. 3 to evaluate the lifespan of the multichip module shown in FIG. 1.
Figure 6:
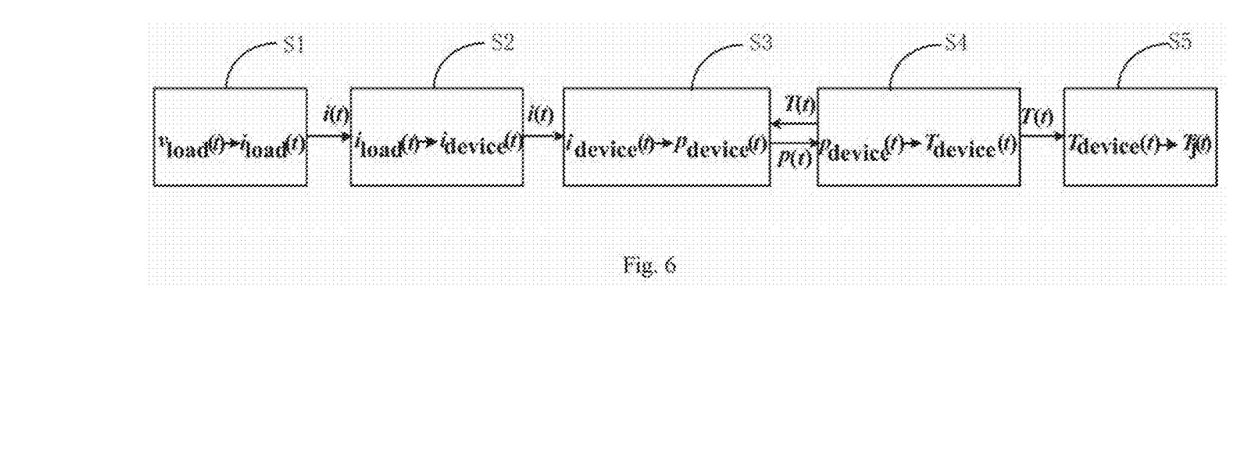
FIG. 6 is a schematic flow chart of a method for determining test stress in the evaluation method shown in FIG. 5.

The structures of the multichip module 100 under evaluation and the evaluation module 200 used for evaluation according to embodiments of the present application have been described above with reference to FIGS. 1-4; the method according to the present application for using the evaluation module 200 with the reduced number of chips to evaluate the lifespan of the multichip module 100 is described below with reference to FIGS. 5-7.

In order to simplify description, the description below takes an SiC module comprising 6 chips as the multichip module under evaluation, and an SiC module comprising a single chip as the evaluation module. The method for evaluating the lifespan of the multichip module according to the present application substantially consists of first performing an accelerated ageing experiment with the single-chip evaluation module, and then calculating an equivalent lifespan model of the 6-chip module according to the results of testing the single-chip evaluation module; the specific steps are as shown in FIG. 5.

As can be seen from FIG. 5, the evaluation method for evaluating the equivalent lifespan of the 6-chip module from the single-chip module comprises the 8 steps below in total.

a. Providing the evaluation module as described above. Based on the structure of the multichip module under evaluation, an evaluation module with a reduced number of chips is made. It should be noted that the evaluation chip of the evaluation module and the chip under evaluation arranged at the corresponding attachment position on the multichip module should have the same cooling performance and sustain the same thermal stress.

b. Determining multiple sets of test stresses and the number of evaluation modules required.

In order to achieve a real prediction of the lifespan of the multichip module under evaluation in actual operating conditions, the test stress needs to obtain the sustained thermal stress according to the actual operating conditions. It is known that an electrothermal coupling method can achieve the transformation from actual operating conditions to the thermal stress sustained by the module under evaluation. As shown in FIG. 6, according to the electrothermal coupling method, the test stress of the evaluation module can be determined by the following steps:

Step S1: using a load model to determine a load current $i_{load}(t)$ from a load change $v_{load}(t)$;

Step S2: using a circuit model to determine a module current $i_{device}(t)$ from the load current $i_{load}(t)$;

Step S3: using a loss model to determine a module loss $p_{device}(t)$ from the module current $i_{device}(t)$;

Step S4: using a thermal model to determine a chip junction temperature $T_{device}(t)$ from the module loss $p_{device}(t)$; and Step S5: using rainflow counting to determine a module test stress $\Delta T_j$ and $T_{jm}$ from the chip junction temperature $T_{device}(t)$.

The electrothermal coupling method described above is a method for determining test stress that is widely used in the art, so is not described further superfluously herein.

In order to determine reliability function parameters of the evaluation module, at least two sets of test stresses should be determined for each evaluation module, and the number of samples that need to be tested under each set of test stresses cannot in theory be less than 4. Thus, the number of evaluation modules can be selected according to the number of stress sets that need to be tested.

c. Performing accelerated lifespan testing of the evaluation modules. Based on the test stresses determined in step b, the evaluation modules are subjected to an accelerated ageing experiment under the test stresses determined, so as to obtain a lifespan t of each evaluation module under each set of test stresses.

d. Calculating the reliability function of the evaluation modules under each set of test stresses. Power SiC modules experience ageing failure in actual operating conditions and accelerated lifespan testing, so the Weibull distribution can be used to calculate the reliability and failure rate thereof under a particular set of test stresses. The reliability function corresponding to the Weibull distribution can be expressed as formula (1):

$$R_e(t) = e^{-(\frac{t}{\eta})^\beta} \quad (1)$$

where $R_e(t)$ is the reliability of the evaluation module, t is the lifespan of the evaluation module, $\eta$ is a scale factor, and $\beta$ is a shape factor.

By determining the lifespans of all evaluation modules under each set of test stresses, the scale factor $\eta$ and shape factor $\beta$ in formula (1) can be calculated.

Figure 7:
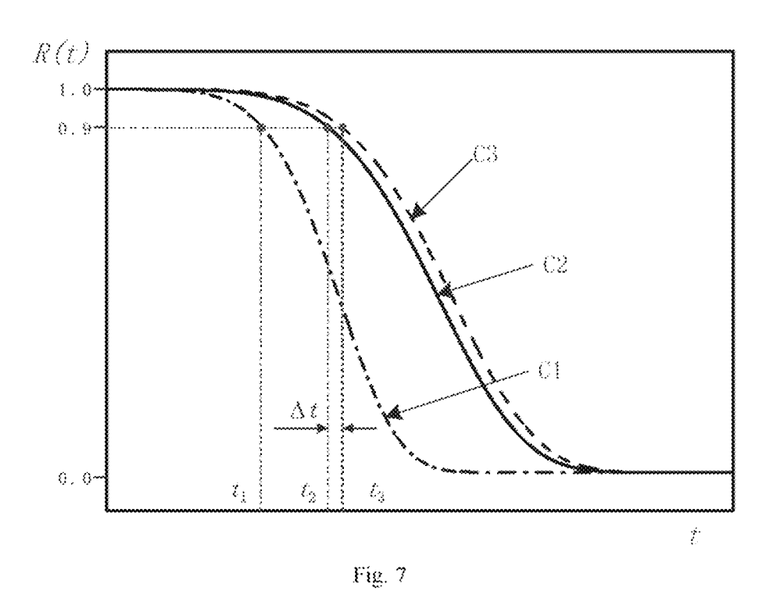
FIG. 7 is a schematic drawing of curves of reliability functions of the evaluation module and multichip module in the evaluation method shown in FIG. 5.

A curve corresponding to the reliability function of the evaluation module under one set of test stresses is as shown by the solid line C2 in FIG. 7. As can be seen from the solid line C2 in FIG. 7, as the module operating time increases, the module reliability begins to fall until failure finally occurs. It should be pointed out that for simplicity, FIG. 7 only shows a curve corresponding to the reliability function of the evaluation module under one set of test stresses; for multiple sets of test stresses, there will be multiple corresponding curves.

e. Calculating a lifespan prediction model of the evaluation module. Under a certain test stress, the lifespan of the evaluation module can be defined as the lifespan corresponding to when the reliability falls to a specified value. For example, in FIG. 7, the lifespan indicated by $t_2$ is the lifespan corresponding to a fall in reliability to 90%, and is also called the $B_{10}$ lifespan. Similarly, the lifespans of different indices such as $B_1$ and $B_5$ can be defined. The higher the reliability, the smaller the corresponding lifespan; and for the same lifespan, a module with higher reliability will be less easily damaged. By testing the evaluation module under different test stresses, multiple $B_{10}$ lifespans can be obtained. With these $B_{10}$ lifespans, the relationship between lifespan and test stress can be calculated by means of a Coffin-Manson lifespan prediction model, as shown by formula (2).

$$N_{fe} = \alpha_e \cdot (\Delta T_{je})^{\beta_e} \quad (2)$$

where $N_{fe}$ is the lifespan of the evaluation module, $\Delta T_{je}$ is the extent of fluctuation of chip junction temperature of the evaluation module, and $\alpha_e$ and $\beta_e$ are calculation constants of the evaluation module.

By determining the lifespan (e.g. the $B_{10}$ lifespan) of the evaluation module under multiple sets of test stresses, the calculation constants $\alpha_e$ and $\beta_e$ in formula (2) can be calculated.

f. Calculating the reliability function of the multichip module under each set of test stresses.

It can be seen from the thermal stress and temperature data of the 6-chip module and the single-chip module shown in Table 1 that in the 6-chip module, the thermal stress and temperature vary to a certain extent from chip to chip. This means that the reliability function corresponding to different chips will vary to a certain extent. To make up for this variation, the lifespan prediction model in formula (2) already determined and the constants $\alpha_e$ and $\beta_e$ calculated in step e can be used to obtain the lifespan of each chip in the multichip module by means of formula (3):

$$N_{fi} = \alpha_e \cdot (\Delta T_{ji})^{\beta_e} \quad (3)$$

where i is an integer from 1 to n, n being the number of chips in the multichip module, $N_{fi}$ is the lifespan of each chip of the multichip module under one set of test stresses, and $\Delta T_{ji}$ is the extent of fluctuation of chip junction temperature of each chip of the multichip module under one set of test stresses;

for example, for a 6-chip module, the lifespans of the chips are:

$$\begin{cases} N_{f1} = \alpha_e \cdot (\Delta T_{j1})^{\beta_e} \\ N_{f2} = \alpha_e \cdot (\Delta T_{j2})^{\beta_e} \\ \ldots \\ N_{f6} = \alpha_e \cdot (\Delta T_{j6})^{\beta_e} \end{cases}$$

Since the thermal stress and temperature of the single-chip module differ very little from the thermal stresses and temperatures of the 6-chip module, it can be approximately judged that the reliability function of each chip of the 6-chip module is obtained from the reliability function of the single-chip module by horizontal shifting. For example, the dashed line C3 in FIG. 7 represents the reliability function of an exemplary chip under evaluation in the 6-chip module; the $B_{10}$ lifespan corresponding thereto is $t_3$, which can be obtained by a horizontal shift of $\Delta t = t_3 - t_2$ from the reliability function of the single-chip module.

Additionally, the reliability function of each chip of the multichip module can be obtained by means of formula (4):

$$R_i(t) = e^{-\left(\frac{t-(N_{fi}-N_{fe})}{\eta}\right)^{\beta}} \quad (4)$$

where i is an integer from 1 to n, n being the number of chips in the multichip module, $R_i(t)$ is the reliability of each chip of the multichip module, and t is the lifespan of the multichip module.

For a 6-chip module, the reliability functions of the chips are:

$$\begin{cases} R_1(t) = e^{-\left(\frac{t-(N_{f1}-N_{fe})}{\eta}\right)^{\beta}} \\ R_2(t) = e^{-\left(\frac{t-(N_{f2}-N_{fe})}{\eta}\right)^{\beta}} \\ \ldots \\ R_6(t) = e^{-\left(\frac{t-(N_{f6}-N_{fe})}{\eta}\right)^{\beta}} \end{cases}$$

Failure of any one chip in the 6-chip module implies failure of the entire module, i.e. the failure of each chip conforms to series failure logic, so the reliability function of the entire module can be expressed as formula (5):

$$R_m(t) = R_1(t) \cdot R_2(t) \cdot R_3(t) \cdot \ldots \cdot R_n(t) \quad (5)$$

where n is the number of chips of the multichip module, $R_m(t)$ is the reliability of the multichip module, and $R_1(t)$ to $R_n(t)$ are the respective reliabilities of the chips of the multichip modules.

As shown in FIG. 7, the reliability function of the multichip module under one set of set stresses is represented by the dash-dotted line C1, and the $B_{10}$ lifespan corresponding thereto is $t_1$.

g. Calculating a lifespan prediction model of the multichip module. Similarly to step e, based on the $B_{10}$ lifespan under different test stresses that is obtained by the reliability function of the 6-chip module, a new lifespan prediction model can be obtained:

$$N_{fm} = \alpha_m \cdot (\Delta T_j)^{\beta_m} \quad (6)$$

where $N_{fm}$ is the lifespan of the multichip module, $\Delta T_j$ is the extent of fluctuation of the chip junction temperature of the multichip module, and $\alpha_m$ and $\beta_m$ are calculation constants of the multichip module.

h. Calculating the lifespan of the multichip module under actual operating conditions. Based on the lifespan prediction model calculated in step g, the stress sustained by the multichip module under actual operating conditions can be substituted into formula (6), so as to obtain the corresponding lifespan. For example, this can be expressed as formula (7):

$$N_{fmr} = \alpha_m \cdot (\Delta T_{jr})^{\beta_m} \quad (7)$$

where $N_{fmr}$ is the lifespan of the multichip module under actual operating conditions, and $\Delta T_{jr}$ is the extent of fluctuation of the chip junction temperature of the multichip module under actual operating conditions.

It should be pointed out that the extents of fluctuation $\Delta T_j$ and $\Delta T_{jr}$ of the chip junction temperature of each chip of the multichip module 100 can be obtained by simulation, for example by ANSYS software. Simulation techniques are widely used in the field of testing, so are not described further superfluously herein.

It should be pointed out that the evaluation method described above uses a single-chip evaluation module, but the method of the present application is likewise suitable for evaluation modules which have a reduced number of chips but comprise multiple chips, the difference being that the amount of calculation is increased somewhat when the reliability function and lifespan prediction model of the evaluation module are calculated as described above. Thus, no further detailed description is set out herein.

By means of the evaluation method described above, the equivalent lifespan of the multichip module under evaluation can be calculated by performing an accelerated ageing experiment on the evaluation module with the reduced number of chips and using the equivalent lifespan evaluation method; thus, the cost of testing is greatly reduced and the testing process is simplified.

The present application has been described in detail above in conjunction with particular embodiments. Obviously, all of the embodiments described above and shown in the drawings should be understood as being exemplary, without limiting the present application. Those skilled in the art could make various alterations or amendments thereto without departing from the spirit of the present application, and all such alterations or amendments would fall within the scope of the present application.

What is claimed is:

1. An evaluation module configured to evaluate the lifespan of a multichip module, the multichip module including a first substrate and multiple chips under evaluation arranged at at least one attachment position on the first substrate, comprising:
   a second substrate configured to be the same as the first substrate of the multichip module, and having at least one attachment position, each of the at least one attachment position corresponding to a corresponding one of the at least one attachment position on the first substrate of the multichip module; and
   at least one evaluation chip configured to be the same as the multiple chips under evaluation of the multichip module, wherein:
   the number of the at least one evaluation chip is less than the number of the multiple chips under evaluation of the multichip module by at least one; and the at least one evaluation chip is arranged at at least one of the at least one attachment position on the second substrate such that the at least one evaluation chip and the chip under evaluation arranged at the corresponding one of the at least one attachment position of the first substrate on the multichip module have the same cooling performance and sustain the same thermal stress during evaluation.

2. The evaluation module according to claim 1, wherein the at least one evaluation chip is a single chip.

3. The evaluation module according to claim 1, wherein:
the evaluation module further comprises at least one chip substitute arranged on the second substrate; and
the at least one evaluation chip and the at least one chip substitute are configured to keep the structure of the evaluation module balanced during evaluation.

4. The evaluation module according to claim 3, wherein the at least one chip substitute is arranged at one of the at least one attachment position on the second substrate.

5. The evaluation module according to claim 4, wherein:
the at least one evaluation chip and the at least one chip substitute are arranged at vertices of a polygon at least comprising a triangle; and
a center of gravity line of a component arranged above the at least one evaluation chip and the at least one chip substitute passes through a region defined by the polygon when the second substrate is placed horizontally.

6. The evaluation module according to claim 3, wherein the at least one chip substitute is made of a material matched to thermomechanical properties of the at least one evaluation chip.

7. The evaluation module according to claim 6, wherein:
the at least one evaluation chip is a silicon carbide MOSFET chip; and
the at least one chip substitute is made of silicon carbide.

8. The evaluation module according to claim 1, wherein:
the multichip module further comprises a third substrate;
the multiple chips under evaluation of the multichip module are arranged between the first substrate and third substrate of the multichip module;
the evaluation module further comprises a fourth substrate; and
at least one of the at least one evaluation chip of the evaluation module is arranged between the second substrate and fourth substrate of the evaluation module.

9. The evaluation module according to claim 8, wherein:
the evaluation module further comprises at least one chip substitute arranged between the second substrate and the fourth substrate; and
the at least one evaluation chip and the at least one chip substitute are configured to keep the fourth substrate structurally balanced during evaluation when the second substrate is placed horizontally.

10. A method for evaluating the lifespan of a multichip module, comprising:
providing the evaluation module according to claim 1;
determining multiple sets of test stresses and the number of the evaluation modules;
performing accelerated lifespan testing of the evaluation module;
calculating a reliability function of the evaluation module under each determined set of the multiple sets of test stresses;
calculating a lifespan prediction model of the evaluation module;
calculating a reliability function of the multichip module under each of the determined multiple sets of test stresses;
calculating a lifespan prediction model of the multichip module; and
calculating the lifespan of the multichip module under actual operating conditions.

11. The method according to claim 10, wherein:
calculating the reliability function of the evaluation module under each of the determined multiple sets of test stresses uses the following formula:

$$R_e(t) = e^{-(\frac{t}{\eta})^\beta}$$

where $R_e(t)$ is the reliability of the evaluation module, t is the lifespan of the evaluation module, $\eta$ is a scale factor, and $\beta$ is a shape factor.

12. The method according to claim 11, wherein:
the lifespan prediction model of the evaluation module is expressed by the following formula:

$$N_{fe} = \alpha_e \cdot (\Delta T_{je})^{\beta_e}$$

where $N_{fe}$ is the lifespan of the evaluation module, $\Delta T_{je}$ is the extent of fluctuation of chip junction temperature of the evaluation module, and $\alpha_e$ and $\beta_e$ are calculation constants of the evaluation module.

13. The method according to claim 12, wherein:
the reliability function of the multichip module under each of the determined multiple sets of test stresses is expressed by the following formula:

$$R_m(t) = R_1(t) \cdot R_2(t) \cdot R_3(t) \cdot \ldots \cdot R_n(t)$$

where n is the number of chips of the multichip module, $R_m(t)$ is the reliability of the multichip module, and $R_1(t)$ to $R_n(t)$ are the respective reliabilities of the chips of the multichip modules.

14. The method according to claim 13, wherein:
the lifespan prediction model of the multichip module is expressed by the following formula:

$$N_{fm} = \alpha_m \cdot (\Delta T_j)^{\beta_m}$$

where $N_{fm}$ is the lifespan of the multichip module, $\Delta T_j$ is the extent of fluctuation of the chip junction temperature of the multichip module, and $\alpha_m$ and $\beta_m$ are calculation constants of the multichip module.

15. The method according to claim 14, wherein:
the lifespan of the multichip module under actual operating conditions is calculated by the following formula:

$$N_{fmr} = \alpha_m \cdot (\Delta T_{jr})^{\beta_m}$$

where $N_{fmr}$ is the lifespan of the multichip module under actual operating conditions, and $\Delta T_{jr}$ is the extent of fluctuation of chip junction temperature of the multichip module under actual operating conditions.

16. The method according to claim 13, wherein calculating the reliability function of the multichip module further comprises:
calculating the lifespan of each chip in the multichip module using calculation constants $\alpha_e$ and $\beta_e$ of the evaluation module and the following formula:

$$N_{fi} = \alpha_e \cdot (\Delta T_{ji})^{\beta_e}$$

where i is an integer from 1 to n, n is the number of chips in the multichip module, $N_{fi}$ is the lifespan of each chip of the multichip module, and $\Delta T_{ji}$ is the extent of fluctuation of chip junction temperature of each chip of the multichip module; and calculating the reliability function of each chip of the multichip module using the following formula:

$$R_i(t) = e^{-\left(\frac{t-(N_{fi}-N_{fe})}{\eta}\right)^\beta}$$

where i is an integer from 1 to n, n is the number of chips in the multichip module, $R_i(t)$ is the reliability of each chip of the multichip module, and t is the lifespan of the multichip module.

17. The method according to claim 16, wherein the extent of fluctuation of chip junction temperature of each chip of the multichip module is obtained by simulation.

* * * * *